United States Patent
Han et al.

(10) Patent No.: US 8,004,184 B2
(45) Date of Patent: Aug. 23, 2011

(54) ELECTRO-LUMINESCENT DISPLAY DEVICE

(75) Inventors: Dong-Won Han, Suwon-si (KR); Jin-Woo Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 920 days.

(21) Appl. No.: 11/149,543

(22) Filed: Jun. 10, 2005

(65) Prior Publication Data

US 2005/0280363 A1    Dec. 22, 2005

(30) Foreign Application Priority Data

Jun. 17, 2004 (KR) .................. 10-2004-0045047

(51) Int. Cl.
*H01J 1/62* (2006.01)
(52) U.S. Cl. ......................................... 313/506; 445/25
(58) Field of Classification Search .......... 313/498–512; 257/59; 445/24–25
See application file for complete search history.

(56) References Cited

U.S. PATENT DOCUMENTS

| | | | |
|---|---|---|---|
| 6,365,917 B1 | 4/2002 | Yamazaki | |
| 6,538,374 B2 * | 3/2003 | Hosokawa | 313/504 |
| 6,737,176 B1 * | 5/2004 | Otsuki et al. | 428/690 |
| 2001/0022498 A1 * | 9/2001 | Yoo | 313/582 |
| 2002/0030440 A1 | 3/2002 | Yamazaki | |
| 2002/0134979 A1 * | 9/2002 | Yamazaki et al. | 257/59 |
| 2003/0062527 A1 * | 4/2003 | Kumar et al. | 257/79 |
| 2003/0230971 A1 | 12/2003 | Arakawa et al. | |
| 2005/0248270 A1 * | 11/2005 | Ghosh et al. | 313/512 |

FOREIGN PATENT DOCUMENTS

| | | |
|---|---|---|
| CN | 1317922 | 10/2001 |
| JP | 2000-173766 | 6/2000 |
| JP | 2002-093586 | 3/2002 |
| JP | 2003-133063 | 5/2003 |
| JP | 2003-191317 | 7/2003 |
| JP | 2004-006284 | 1/2004 |
| JP | 2004-039542 | 2/2004 |
| JP | 2004-139767 | 5/2004 |
| JP | 2004139767 | 5/2004 |
| KR | 20-0257242 | 12/2001 |

OTHER PUBLICATIONS

Chinese Office Action dated Jul. 4, 2008.

* cited by examiner

*Primary Examiner* — Anne M Hines
(74) *Attorney, Agent, or Firm* — H.C. Park & Associates, PLC

(57) ABSTRACT

The present invention provides an electro-luminescent (EL) display device and a method of fabricating the same. The EL display device includes a substrate including a display region. The display origin may include a first electrode layer, a second electrode layer, and an emission portion interposed therebetween. A seal member may seal at least the display region. A blocking layer interposed between the seal member and the second electrode layer may overlap the display region.

17 Claims, 6 Drawing Sheets

ELECTRO-LUMINESCENT DISPLAY DEVICE

CROSS-REFERENCE TO RELATED APPLICATION

This application claims priority to Korean Patent Application No. 10-2004-0045047, filed on Jun. 17, 2004, in the Korean Intellectual Property Office, the disclosure of which is herein incorporated by reference in its entirety.

BACKGROUND OF THE INVENTION

1. Field of the Invention

The present invention relates to flat panel displays generally, and more particularly, to an electroluminescent (EL) display device having a structure that prevents an emission portion from being damaged during fabrication.

2. Description of the Related Art

Flat panel displays, such as liquid crystal displays (LCDs) or organic or inorganic electro-luminescent (EL) displays, may be either a passive matrix (PM) type or active matrix (AM) type depending on the driving method employed. In a PM type flat panel display, a plurality of anodes are arranged in columns and a plurality of cathodes are arranged in rows. In operation, a row driving circuit transmits a scan signal to a single cathode selected from a row. Similarly, a column driving circuit transmits a data signal to a pixel selected from a row.

AM type flat panel display is widely used as a device for displaying moving pictures since it efficiently processes high bandwidth signals by using a thin film transistor (TFT) to control the signal input to each pixel.

An organic EL display sandwiches an organic emission layer between an anode and a cathode. When an anode voltage and a cathode voltage are applied to the anode and the cathode, respectively, holes introduced from the anode are transported to the emission layer via a hole transport layer, and electrons introduced from the cathode are transported to the emission layer via an electron transport layer. In the emission layer, the electrons and the holes recombine to produce excitons. As the excited state of the excitons changes to a ground state, fluorescent molecules on the emission layer emit light to form an image. Full-color organic EL displays include pixels emitting three colors, red (R), green (G), and blue (B).

For EL displays generally, and organic EL displays particularly, longevity of the display depends on keeping an organic emission portion of a display region as free from moisture as possible.

Various conventional methods and apparatuses have attempted to provide a moisture-proof solution. One such method disclosed in Korean Patent Laid-open Publication No. 2002-0065125 applies an ultraviolet (UV)-curing sealant to the edge of an emission substrate, assembles the emission substrate to a seal substrate, and cures the sealant with UV rays. The energy of the UV rays may however permeate an organic emission portion. During the sealing of the organic emission portion, however, such energy may transmit through an upper layer formed on the organic emission portion and damage the organic emission portion.

Another technique disclosed in Korean Patent Laid-open Publication No. 2000-0065694 interposes a LiF layer between a cathode and an emission layer to improve color efficiency. A similar approach was adopted in Japanese Patent Laid-open Publication No. 2000-200683, which interposes a LiF layer as an electron injection layer (EIL) between a cathode and an organic layer.

In both cases, the LiF layer is limited in thickness. Accordingly, the LiF layer cannot effectively protect the organic emission portion from external energy, such as UV rays. Accordingly, a solution is needed that provides a moisture-proof emission layer and a method of manufacturing the same that minimizes or prevents damage to the emission layer during manufacture.

SUMMARY OF THE INVENTION

The present invention provides an electro-luminescent (EL) display device, in which an emission portion is effectively sealed against moisture and external energy so as to increase the life span of the EL display.

In one embodiment, an EL display device comprises a substrate including a display region. The display region may have a first electrode layer, a second electrode layer, and an emission portion interposed therebetween. A seal member may seal at least the display region. A blocking layer interposed between at least a portion of the seal member and the second electrode layer may overlap at least the display region.

Another embodiment of the invention provides a method of fabricating an EL display device. The method includes forming at least one display region on one surface of an integral substrate, each display region comprised of one or more pixels; forming a blocking layer on at least a portion of the display region; forming one or more seal layers on the blocking layer; curing the seal layers; and scribing the integral substrate.

Yet another embodiment of the invention provides a method of fabricating an EL display device. The method includes forming at least one display region on one surface of an integral substrate, the display region comprised of one or more pixels; forming a plurality of seal layers for sealing the display region on at least a portion of the display region; curing at least portions of the seal layers; and scribing the integral substrate. The step to forming the seal layers may comprise forming a blocking layer between at least one adjacent pair of seal layers.

Another embodiment of the invention provides a method of fabricating an EL display device. The method includes forming at least one display region on one surface of an integral substrate, the display region comprised of one or more pixels; forming a blocking layer on the display region; sealing the display region and a seal substrate using a sealant; curing at least the sealant; and scribing the integral substrate.

Another embodiment of the invention provides a method of fabricating an EL display device. The method includes forming at least one display region on one surface of an integral substrate, the display region comprised of one or more pixels; forming a blocking layer on one surface of a seal substrate that corresponds to the display region; sealing the display region along with the seal substrate using a sealant; curing at least the sealant; and scribing the integral substrate.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1A:
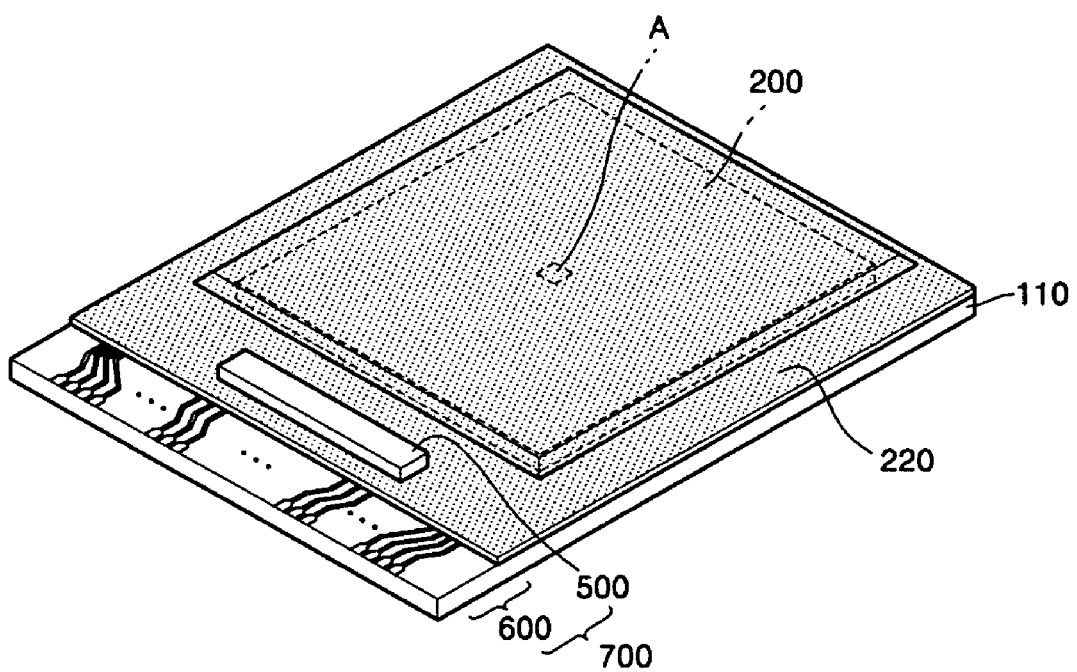
FIG. 1A is a perspective view of an organic electro-luminescent (EL) display according to an embodiment of the present invention.

FIG. 1A is a perspective view of an electro-luminescent (EL) display device manufactured according to the principles of the present invention.

Referring to FIG. 1A, a display region 200 comprised of one or more pixels is located on one surface of a substrate 110. A pad portion 700 is located on at least one side of the display region 200. The pad portion 700 includes a terminal portion 600, which includes one or more terminals.

The pad portion 700 may further include electronic elements, each having a driving circuit portion such as a driver. Specifically, electronic elements that transmit electric signals to the display region 200, for example, vertical/horizontal driving circuit portions, such as scan and data drivers that transmit a scan signal and/or a data signal to the pixels of the display region 200, may be located outside the display region 200. Like a vertical driving circuit 500 shown in FIG. 1A, the vertical/horizontal driving circuit portions may be interposed between the display region 200 and the terminal portion 600. A vertical/horizontal driving circuit portion may be a chip on glass (COG) integrated circuit (IC), or may not be included in the pad portion 700 but be an external electrical element such as a flexible printed circuit (FPC).

Figure 1B:
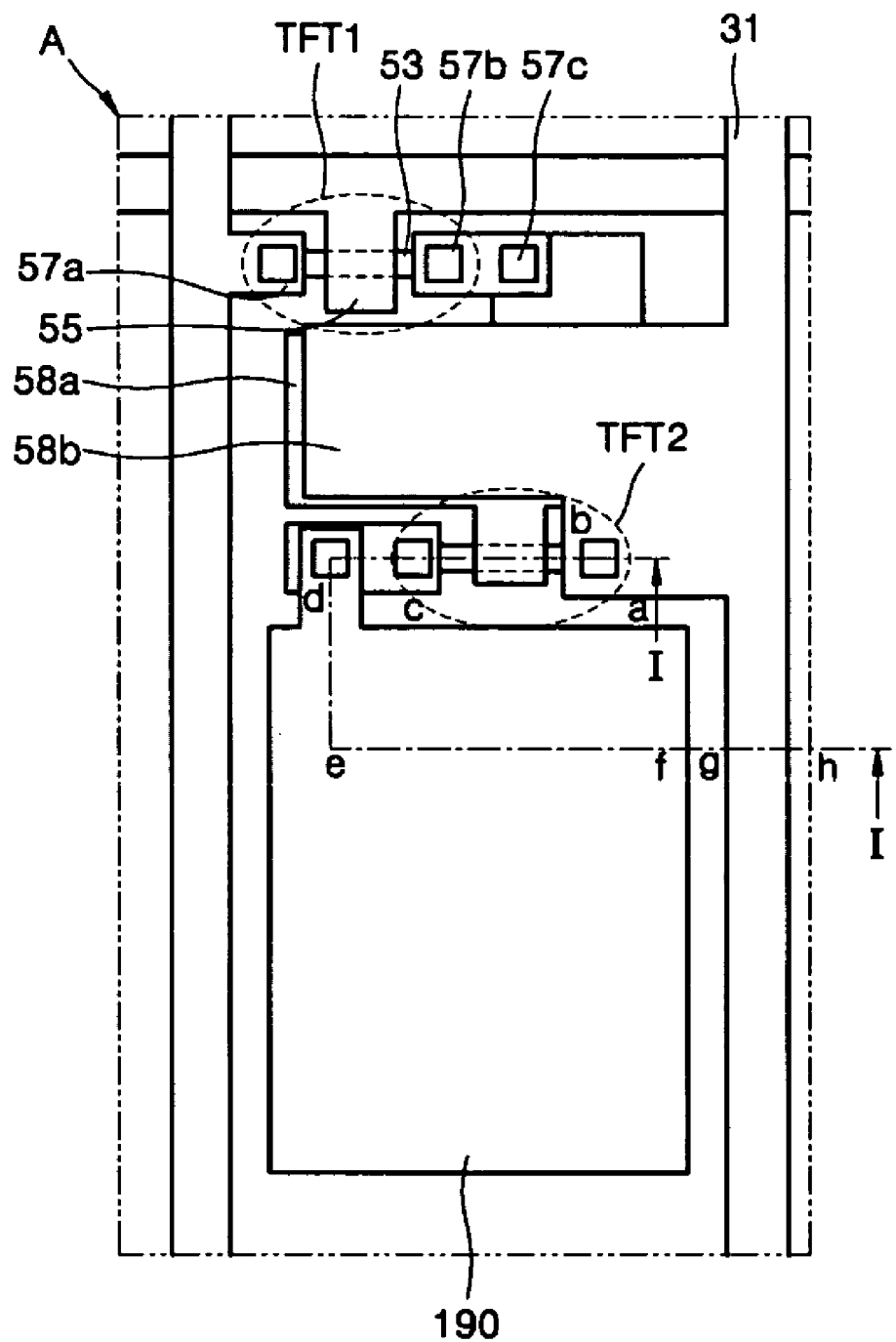
FIG. 1B is an exploded view of portion "A" shown in FIG. 1A.

FIG. 1B is an exploded view of a portion "A" shown in FIG. 1A. Here, the portion "A" corresponds to one pixel. Although FIG. 1B illustrates by way of example that one pixel comprises two top gate type thin film transistors and a single capacitor, the present invention is not limited thereto.

A gate electrode 55 of a first thin film transistor TFT1, which determines the selection of a pixel, extends from a scan line via which a scan signal is applied. When an electrical signal, such as the scan signal, is applied to the scan line, a data signal input via a data line is transmitted from a source electrode 57a of the first thin film transistor TFT1 through a semiconductor active layer 53 of the first thin film transistor TFT1 to a drain electrode 57b of the first thin film transistor TFT1.

An extension portion 57c of the drain electrode 57b of the first thin film transistor TFT1 is connected to one end of a first electrode 58a of the capacitor. The other end of the first electrode 58a of the capacitor forms a gate electrode 150 of a second thin film transistor TFT2 which is a driving thin film transistor. A second electrode 58b of the capacitor is electrically connected to a drive line 31, which connects to a driving power supply line (not shown).

Figure 1C:
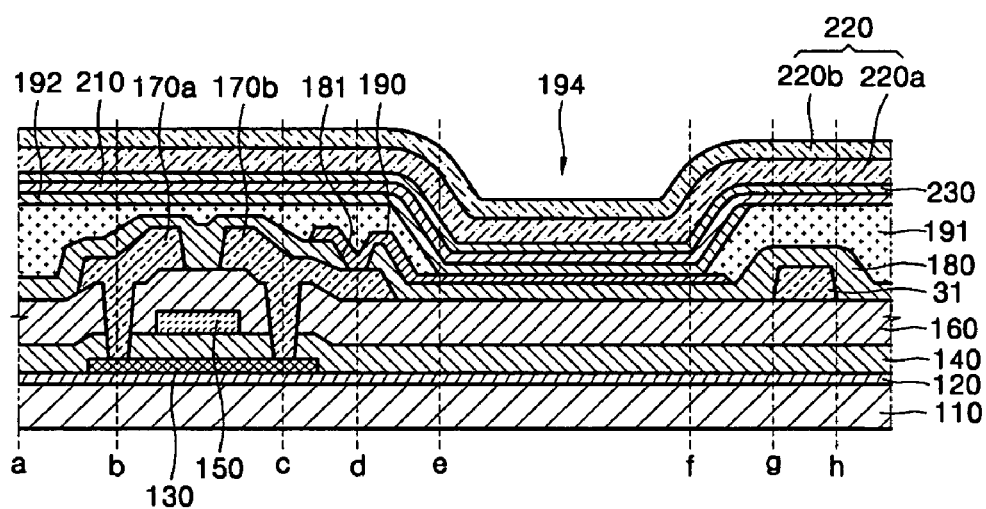
FIG. 1C is a cross-sectional view taken along line I-I of FIG. 1B.

FIG. 1C is a cross-sectional view taken along line I-I of FIG. 1B.

Referring to FIG. 1C, the portion between reference characters (a) and (d) is a section of the second thin film transistor TFT2 as the driving thin film transistor, the portion between (e) and (f) is a section of a pixel opening 194, and a portion between (g) and (h) is a section of the drive line. In the second thin film transistor TFT2, a semiconductor active layer 130 is formed on a buffer layer 120 formed on one surface of the substrate 110. The semiconductor active layer 130 may be formed of amorphous silicon (a-Si) or polycrystalline silicone (poly-Si). Although not shown in the drawings, the semiconductor active layer 130 includes a source region and a drain region, each of which is doped with n$^+$or p$^+$-type dopants, and a channel region. Such a semiconductor active layer 130 may be formed of an organic semiconductor and may have various structures.

The gate electrode 150 of the second thin film transistor TFT2 is located on the semiconductor active layer 130. The gate electrode 150 may be formed of a material such as MoW or Al/Cu, in consideration of close adhesion to adjacent layers, flatness of stacked layers, and easy processing, but the present invention is not limited thereto.

In order to electrically insulate the gate electrode 150 from the semiconductor active layer 130, a gate insulating layer 140 is located therebetween. An interlayer 160, which may be either a single or multilayer insulating layer, may be formed on the gate electrode 150 and the gate insulating layer 140, and source and drain electrodes 170a and 170b of the second thin film transistor TFT2 are formed thereon. The source and drain electrodes 170a and 170b may be formed of a metal such as MoW, and annealed later to be in ohmic contact with the semiconductor active layer 130.

A protective layer 180, which may include a passivation layer and/or a planarization layer, is formed on the source and drain electrodes 170a and 170b, and a first electrode layer 190 is formed thereon. The first electrode layer 190 is electrically connected to one of the source and drain electrodes 170a and 170b through a via hole 181 formed in the protective layer 180. For rear surface emission displays, the first electrode layer 190 may include a transparent electrode formed of indium tin oxide (ITO). For front surface emission displays, the first electrode layer 190 may include a reflective electrode formed of Al/Ca and a transparent electrode formed of ITO. The first electrode layer 190 may be varied as necessary. Here, although it is described to clarify explanation that the first electrode layer 190 serves as an anode, the present invention is not limited thereto. That is, the first electrode layer 190 may act as a cathode. Alternatively, other various structures can be used.

The protective layer 180 may have various forms. For example, the protective layer 180 may be formed of an organic or inorganic material and may include a single layer or a double layer of, for example, a $SiN_x$, layer and an organic layer of a benzocyclobutene (BCB) or acryl layer.

On the protective layer 180 outside the pixel opening 194 corresponding to the first electrode layer 190, a pixel defining layer 191 may be formed. An emission portion 192 including an emission layer may be located on one surface of the first electrode layer 190, in the pixel opening 194.

The emission portion 192 may comprise either a monomer or polymer organic layer. A monomer organic layer can be formed by stacking a hole injection layer (HIL), a hole transport layer (HTL), an organic emission layer (EML), an electron transport layer (ETL), and an electron injection layer (EIL) in a simple or complex structure. Various organic materials can be used, including copper phthalocyanine (CuPc), N,N'-Di(naphthalene-1-yl)-N,N'-diphenyl-benzidine (NPB), and tris-8-hydroxyquinoline aluminum (Alq3). These monomer organic layers are formed by vacuum deposition.

A polymer organic layer can comprise a hole transport layer (HTL) and an emission layer (EML). Here, the hole transport layer can be formed of PEDOT, and the emission layer can be formed of a polymer organic material, such as poly-phenylenevinylene (PPV)-containing material and polyfluorene-containing material, by screen printing or inkjet printing.

A second electrode layer 210, as a cathode, is formed on the entire or part of the surface of the emission portion 192. Also, the second electrode layer 210 may be formed of Al/Ca, ITO, or Mg—Ag according to the emission type. The second electrode layer 210 may be a single or double layer and further include an alkaline layer or an alkaline earth metal fluoride layer such as a LiF layer.

On one surface of the second electrode layer 210, a seal layer 220 is formed to protect at least the display region 200. The seal layer 220 may be formed of an inorganic material such as $SiO_2$ or $SiN_x$ or an organic material such as siloxane, siloxane derivatives, or acrylate. Although FIG. 1C shows that the seal layer 220 includes two seal layers 220a and 220b, the seal layer 220 of the present invention may be a single layer or a multiple layer instead.

In the EL display device of the present invention, a blocking layer 230 formed of one or more layers is interposed between the second electrode layer 210 and the seal layer 220. However, the present invention is not limited thereto. If the seal layer 220 includes multiple seal layers, the blocking layer 230 may be interposed therebetween.

The seal layer 220, especially the seal layer 220 formed of an organic material, must be cured for activation. The curing of the seal layer 220 may be performed using various methods, such as ultraviolet (UV) irradiation or heat curing. Heat and/or UV rays are applied from the outside of the seal layer 220 toward the second electrode layer 210. Particularly, the front surface emission display device includes the thin second electrode layer 210. Thus, the applied heat and/or UV rays may permeate the second electrode layer 210 and damage the emission portion 192. However, the blocking layer 230 interposed between the second electrode layer 210 and the seal layer 220 prevents damage to the emission portion 192.

The blocking layer 230 may be formed of various materials, such as Li, Ca, LiF, $CaF_2$, or $MgF_2$.

In addition to the type of material used to form the blocking layer 230, the thickness of the blocking layer 230 should be considered. As the blocking layer 230 becomes thicker, the emission portion 192 located under the second electrode layer 210 is protected more effectively, but process time lengthens. If the blocking layer 230 is excessively thick, the color coordinate of light emitted from the emission portion 192 may be shifted. On the other hand, if the blocking layer 230 is excessively thin it will transmit heat and UV rays and thus may not properly function as a blocking layer. Accordingly, the thickness of the blocking layer 230 should be appropriately adjusted and is preferably about 10 Å to about 50 Å of the above-description.

FIG. 2A, FIG. 2B, FIG. 2C, and FIG. 2D are perspective and cross-sectional views illustrating a process of fabricating an organic EL display according to embodiments of the present invention.

On one surface of a large integral substrate 110', which will later be scribed into individual organic EL displays, a display region comprised of one or more pixels is formed, and a pad portion, which includes a terminal portion 600 comprised of one or more terminals located on at least one side of the display region 200. In order to seal at least the display region 200 along with the integral substrate 100' using a sealant 210, a seal portion 300 is located between the display region 200 and the terminal portion 600.

The pad portion may further include electronic elements, each having a driving circuit portion 500 such as a driver. Specifically, electronic elements that transmit electric signals to the display region 200, for example, vertical/horizontal driving circuit portions, such as scan data drivers that transmit a scan signal and/or a data signal to the pixels of the display region 200, may be located between the display region 200 and the seal portion 300 or outside the seal portion 300. A vertical/horizontal driving circuit portion may be a COG IC or be an external electronic element such as an FPC. The vertical/horizontal driving circuit portion may have various forms. The structure of each pixel constituting the display region 200 is described above and thus will not be repeated here.

Figure 2A:
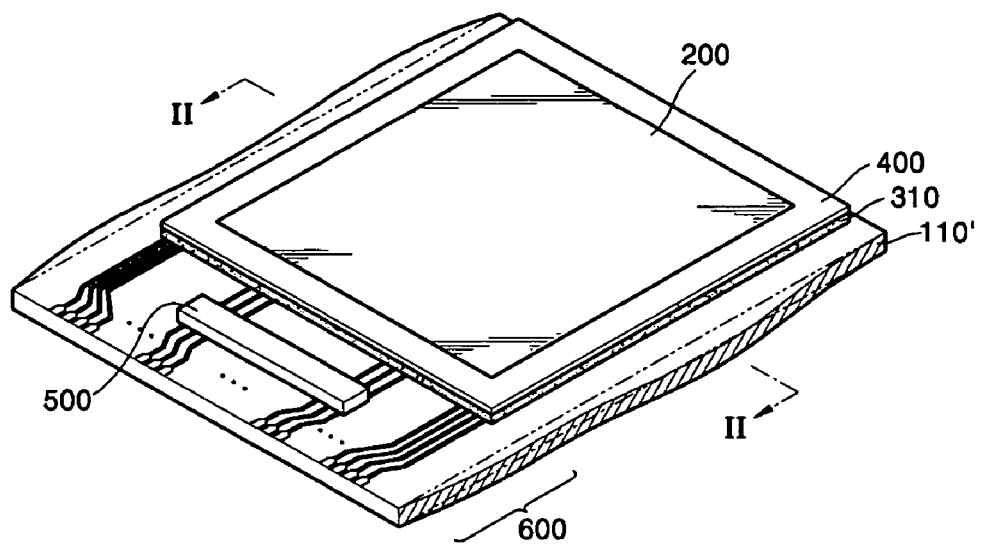
FIG. 2A, FIG. 2B, FIG. 2C and FIG. 2D are perspective cross-sectional views illustrating a process of fabricating an organic EL display according to embodiments of the present invention.
Figure 2B:
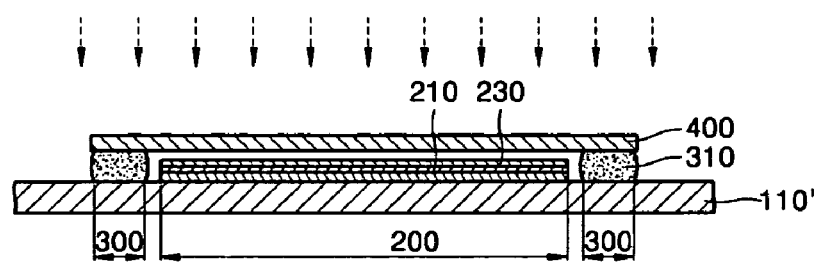
Figure 2C:
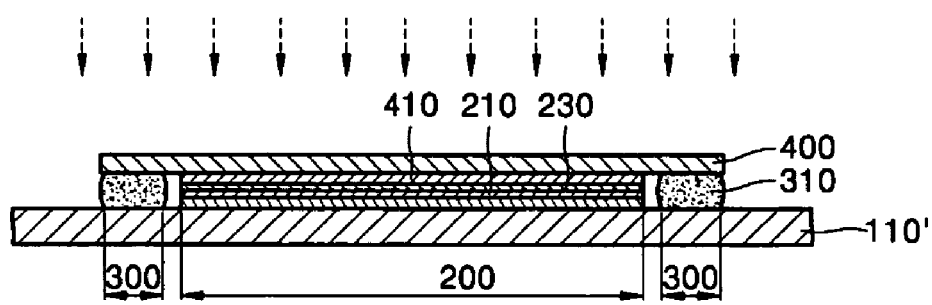

A sealant 310 is coated on each seal portion 300 of each organic EL display formed on the integral substrate 110', and a seal substrate 400 as a seal member is located thereon. The seal substrate 400 and the integral substrate 110' are sealed so that the display region 200 is sealed. As shown in FIG. 2B, a predetermined plenum (space or enclosure in which a moisture-proof gas is at a pressure greater than that of the outside atmosphere) may be formed between the seal substrate 400 and a stack portion stacked on the integral substrate 110'. Optionally, as shown in FIG. 2C, the seal substrate 400 may contact the stack portion through an adhesive 410 to prevent depression of the seal substrate 400 due to the plenum. The seal substrate 400 is not limited to the above-described structure, and various other structures may be used instead.

During the sealing process, as shown in FIG. 2B, UV rays and/or heat is applied to the top surface of the seal substrate 400 to effectively cure the sealant 310 and /or the adhesive. To prevent damage to the emission portion 192 due to the applied UV rays and/or heat, a blocking layer 230 is interposed between the second electrode layer 210 and the seal substrate 400. As described in the previous embodiment, the blocking layer 230 may be formed of Li, Ca, LiF, $CaF_2$, or $MgF_2$ to a thickness of about 10 Å to about 50 Å.

Figure 2D:
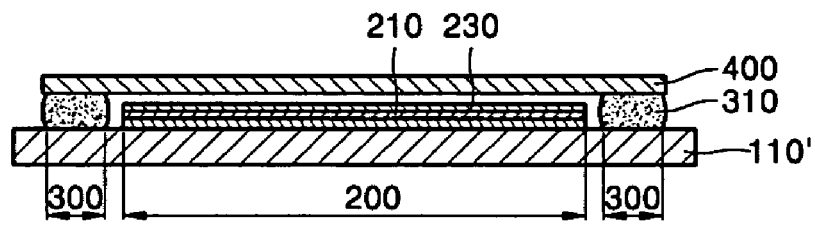

After curing the sealant 310 and/or the adhesive, as shown in FIG. 2D, the integral substrate 110' is scribed, thus obtaining individual organic EL display devices.

Figure 3:
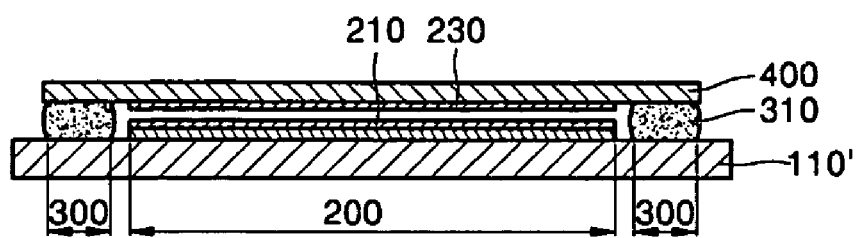
FIG. 3 is a cross-sectional view of an organic EL display according to another embodiment of the present invention.

A blocking layer of an organic EL display having a seal substrate is not limited to the above-described embodiments but can have other structures. For example, as shown in FIG. 3, a blocking layer 230 may be formed on one surface of a seal substrate 400 as a seal member, which faces a display region 200. That is, the blocking layer 230 is located to correspond to the display region 200. Optionally, the blocking 230 may be formed on an entire surface of the seal substrate 400, except on a seal portion 300, which should contact the sealant 310 to form a reliable moisture-proof structure. As described above, after a blocking layer is formed on one surface of a seal substrate, an integral substrate and a seal substrate are sealed using a sealant, the sealant is cured, and then the integral substrate is scribed into respective EL displays.

The foregoing embodiments are merely exemplary, and do not limit the present invention. Although an AM type organic EL display is described in the embodiments, the present invention can be applied to inorganic EL displays or PM type display devices.

In an EL display device manufactured according to the principles of the present invention, the following effects may be obtained: A blocking layer located between a seal member and a second electrode layer prevents damage to an emission portion due to externally applied UV rays and/or heat. Second, since the EL display of the present invention includes a blocking layer of an appropriate thickness, not only is damage to an emission portion due to externally applied energy prevented, but also the color coordinate of light emitted from the emission portion is not shifted. Third, in the EL display of the present invention, a blocking layer may be located on one surface of a second electrode layer stacked on an integral substrate, or one surface of a seal substrate, which faces a display region. That is, the blocking layer may be formed in appropriate positions according to the design specification.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electro-luminescent display device, comprising:
a substrate including a display region having a first electrode layer, a second electrode layer, and an emission portion interposed therebetween;
a seal member sealing at least the display region; and
a blocking layer interposed between at least a portion of the seal member and the second electrode layer and overlapping at least the display region,
wherein there is an empty space having a moisture-proof gas at a pressure greater than an outside atmosphere pressure between the blocking layer and one of the seal member and the second electrode,
wherein the display region overlaps the entire blocking layer such that no portion of the blocking layer extends beyond the display region, and
wherein the blocking layer is formed of at least one material selected from the group consisting of Li, Ca, LiF, $CaF_2$, and $MgF_2$.

2. The device of claim 1, wherein the seal member includes one or more seal layers.

3. The device of claim 1, wherein the blocking layer is located on one surface of the second electrode layer.

4. The device of claim 2, wherein the blocking layer is located between the seal layers.

5. The device of claim 1, wherein the seal member is a seal substrate.

6. The device of claim 5, wherein the blocking layer is formed on one surface of the seal substrate, which faces the display region.

7. The device of claim 1, wherein the thickness of the blocking layer is about 10 Å to about 50 Å.

8. The device of claim 1, wherein the seal member includes one or more seal layers and a seal substrate.

9. The device of claim 8, wherein the blocking layer is formed on one surface of the seal substrate, which faces the display region.

10. A method for fabricating an electro-luminescent display device, comprising:
forming at least one display region on one surface of an integral substrate, each display region comprised of one or more pixels;
forming a blocking layer on at least a portion of the display region;
coating a sealant on seal portions of the at least one display region;
arranging a seal member on the sealant such that there is an empty space having a moisture-proof gas at a pressure greater than an outside atmosphere pressure between the seal member and the blocking layer;
curing the sealant; and
scribing the integral substrate,
wherein the display region overlaps the entire blocking layer such that no portion of the blocking layer extends beyond the display region, and
wherein the blocking layer is formed of at least one material selected from the group consisting of Li, Ca, LiF, $CaF_2$, and $MgF_2$.

11. The method of claim 10, wherein curing the sealant is performed using UV energy or heat energy.

12. The method of claim 10, wherein the seal member includes one or more seal layers.

13. The method of claim 10, wherein the seal member is a seal substrate.

14. A method for fabricating an electro-luminescent display device, comprising:
forming at least one display region on one surface of an integral substrate, the display region comprised of one or more pixels;
forming a plurality of seal layers for sealing the display region on at least a portion of the display region;
curing at least portions of the seal layers; and
scribing the integral substrate,
wherein forming the seal layers comprises forming a blocking layer, the entire blocking layer being between at least one adjacent pair of the seal layers,
wherein a first seal layer of the plurality of seal layers is arranged between the display region and the blocking layer,
wherein the blocking layer is not interposed between the first seal layer and the integral substrate, and
wherein the blocking layer is formed of at least one material selected from the group consisting of Li, Ca, LiF, $CaF_2$, and $MgF_2$.

15. The method of claim 14, wherein curing the seal layers is performed using UV energy or heat energy.

16. A method for fabricating an electro-luminescent display device, comprising:
forming at least one display region on one surface of an integral substrate, the display region comprised of one or more pixels;
forming a blocking layer on one surface of a seal substrate, which corresponds to the at least one display region;
sealing the integral substrate with the seal substrate using a sealant, such that there is an empty space having a moisture-proof gas at a pressure greater than an outside atmosphere pressure space between the blocking layer and the one or more pixels;
curing at least the sealant; and
scribing the integral substrate,
wherein the display region overlaps the entire blocking layer such that no portion of the blocking layer extends beyond the display region, and
wherein the blocking layer is formed of at least one material selected from the group consisting of Li, Ca, LiF, $CaF_2$, and $MgF_2$.

17. The method of claim 16, wherein curing the sealant is performed using UV energy or heat energy.

* * * * *